(12) United States Patent
Moon et al.

(10) Patent No.: US 9,654,147 B2
(45) Date of Patent: May 16, 2017

(54) CONCATENATED ERROR CORRECTION DEVICE

(71) Applicant: KOREA ADVANCED INSTITUTE OF SCIENCE AND TECHNOLOGY, Daejeon (KR)

(72) Inventors: Jaekyun Moon, Daejeon (KR); Geunyeong Yu, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 55 days.

(21) Appl. No.: 14/555,656

(22) Filed: Nov. 27, 2014

(65) Prior Publication Data
US 2015/0155888 A1 Jun. 4, 2015

(30) Foreign Application Priority Data

Nov. 29, 2013 (KR) ........................ 10-2013-0146976

(51) Int. Cl.
| | | |
|---|---|---|
| *H03M 13/00* | (2006.01) | |
| *H03M 13/29* | (2006.01) | |
| *G06F 11/10* | (2006.01) | |
| *H03M 13/11* | (2006.01) | |
| *H03M 13/15* | (2006.01) | |

(Continued)

(52) U.S. Cl.
CPC ..... *H03M 13/2912* (2013.01); *G06F 11/1012* (2013.01); *H03M 13/293* (2013.01); *H03M 13/1102* (2013.01); *H03M 13/152* (2013.01); *H03M 13/1515* (2013.01); *H03M 13/19* (2013.01); *H03M 13/3761* (2013.01)

(58) Field of Classification Search
None
See application file for complete search history.

(56) References Cited

U.S. PATENT DOCUMENTS

| | | | | |
|---|---|---|---|---|
| 7,107,505 B2* | 9/2006 | Thesling, III | ..... | H03M 13/2742 714/701 |
| 7,340,663 B2* | 3/2008 | Van Dijk | .......... | H03M 13/2906 714/755 |

(Continued)

FOREIGN PATENT DOCUMENTS

| | | |
|---|---|---|
| KR | 10-2008-0076613 A | 8/2008 |
| KR | 10-2010-0113135 A | 10/2010 |
| WO | WO 2009/107267 | 9/2009 |

OTHER PUBLICATIONS

Korean Intellectual Property Office, Office Action, Korean Patent Application No. 10-2013-0146976, Dec. 17, 2014, four pages [with concise explanation of relevance in English].

*Primary Examiner* — M. Mujtaba Chaudry
(74) *Attorney, Agent, or Firm* — Fenwick & West LLP (57) ABSTRACT

A concatenated error correction device may be provided that includes: a first encoder which encodes a plurality of blocks arranged in a column direction and a row direction into a block-wise product code consisting of column codes and row codes by applying a first error correction code to the blocks in each of the column direction and the row direction; and a second encoder which receives K number of source symbols and applies a second error correction code to the source symbols, and then encodes into N number of symbols including N-K number of parity symbols. The N number of symbols form the plurality of blocks. K and N are natural numbers.

9 Claims, 4 Drawing Sheets

ERASURE CHANNEL (51) Int. Cl.
*H03M 13/19* (2006.01)
*H03M 13/37* (2006.01)

(56) References Cited

U.S. PATENT DOCUMENTS

| | | | |
|---|---|---|---|
| 2003/0106008 A1* | 6/2003 | Butler | H03M 13/1515 |
| | | | 714/752 |
| 2012/0260150 A1* | 10/2012 | Cideciyan | G06F 11/1008 |
| | | | 714/773 |
| 2014/0006897 A1* | 1/2014 | Franceschini | H04L 1/0045 |
| | | | 714/755 |

* cited by examiner

CONCATENATED ERROR CORRECTION DEVICE

CROSS-REFERENCE TO RELATED APPLICATION

This application claims priority under 35 U.S.C. §119(a) to Republic of Korea Patent Application No. 10-2013-0146976, filed on Nov. 29, 2013, which is incorporated by reference herein in its entirety.

BACKGROUND

1. Technical Field

This embodiment relates to a concatenated error correction device, and more particularly to a concatenated error correction technique which uses two error correction codes for correcting errors in a unit of a memory page.

2. Description of Related Art

A single-level cell (SLC) memory stores 1 bit-data in one memory cell. The SLC memory is also called a single-bit cell (SBC) memory. A process for storing data in a memory cell (single-level cell) of the SLC memory is called a program process and is able to change a threshold voltage of the memory cell. For example, when a logical data of "1" is stored in the single-level cell, the single-level cell may have a threshold voltage of 1.0V, and when a logical data of "0" is stored in the single-level cell, the single-level cell may have a threshold voltage of 3.0V.

Due to the minute difference between the electrical characteristics of the single-level cells, a threshold voltage formed in each of the single level cells in which the same data has been programmed comes to have a distribution with a certain range. For example, when a voltage read from the memory cell is from 0.5V to 1.5V, the logical data stored in the memory cell may be determined as 1, and when the voltage read from the memory cell is from 2.5V to 3.5V, the logical data stored in the memory cell may be determined as 0. The data stored in the memory cell are distinguished according to a current difference and a voltage difference of the memory cell when the data are read.

Meanwhile, in response to the requirement for high integration of the memory, a multi-level cell (MLC) memory allowing two or more bit data to be programmed in one memory cell has been proposed. The MLC memory is also called a multi-bit cell (MBC) memory. However, the more the number of the bits which are programmed in one memory cell increases, the more the reliability decreases and the more the read failure rate increases. In order that the m bits are programmed in one memory cell, any one of $2^m$ threshold voltages should be formed in the memory cell. Due to the minute difference between the electrical characteristics of the memory cells, the threshold voltages of the memory cells in which the same data has been programmed may form a distribution with a certain range. Here, one distribution of the threshold voltage may correspond to each of the $2^m$ data values which can be generated by the m bits. However, since the voltage window of the memory is limited, a distance between the $2^m$ distributions of the threshold voltage between the adjacent bits is reduced with the increase of m. When the distance between the distributions is more reduced, the distributions may be overlapped with each other. When the distributions are overlapped with each other, the read failure rate may increase.

For the purpose of reducing the read failure rate, error control codes or error control coding or error correction codes (ECC) are being actively used and researches are being actively devoted to how to effectively program so as to reduce errors. A memory controller controls memory access of a host. The memory controller converts a virtual memory address into an actual memory address and performs memory protection, cache management, bus arbitration, etc. In general, one page is mapped onto one address. The one page is composed of 4 to 8 words. Each word may be protected by the ECC.

Hamming code or Bose-Chadhuri-Hocquenghem (BCH) code is widely used as the ECC. However, as the read failure rate increases, there is a requirement for the ECC capable of more powerfully correcting errors.

Low density parity check (LDPC) code and Turbo code, etc., are mentioned as the ECC for the next-generation flash memory. However, the excellent error correction capability of such codes can be ensured when soft output information is given from the channel. Due to the characteristics of the flash memory, multiple readings should be carried out to obtain the soft output information. However, this causes a significant reduction of the data read speed of a system.

The BCH code having powerful error correction capability may be proposed to be used. However, regarding a BCH decoder, the decoding complexity increases rapidly with the increase of the error correction capability.

There is a need for an encoding technique and a decoding technique which are capable of significantly improving the error correction capability without requiring the soft output information and of preventing the decoding complexity from being increased.

SUMMARY

One embodiment is a concatenated error correction device. The concatenated error correction device includes: a first encoder which encodes a plurality of blocks arranged in a column direction and a row direction into a block-wise product code consisting of column codes and row codes by applying a first error correction code to the blocks in each of the column direction and the row direction; and a second encoder which receives K number of source symbols and applies a second error correction code to the source symbols, and then encodes into N number of symbols including N-K number of parity symbols. The N number of symbols form the plurality of blocks. K and N are natural numbers.

The concatenated error correction device according to the embodiment of the present invention may further include: a first decoder which decodes the block-wise product code received from a channel detector, by applying the first error correction code; and a second decoder which decodes the block where the first decoder has failed to decode, by applying the second error correction code.

DETAILED DESCRIPTION

In the following description, an embodiment of the present invention will be described in detail such that those skilled in the art to which the present invention belongs will embody the technical idea of the present invention with reference to the accompanying drawings. However, the present invention may be embodied in various forms and is not limited to the embodiment described in the present specification. In the drawings, parts irrelevant to the description will be omitted for a clear description of the present invention. Similar reference numerals will be assigned to similar parts throughout this patent document.

In the embodiment of the present invention, it is intended that the error correction capability of a memory page is improved by using a concatenated code.

One of methods for significantly improving the error correction capability of the page by using Bose-Chadhuri-Hocquenghem (BCH) code is to use two relatively short BCH codes as the concatenated code by the product operation. The method is to two-dimensionally arrange the entire data and to form parity bits by using the BCH code with respect to each of the row direction and the column direction. Here, it means that the relatively short BCH code is relatively short with respect to the length of the BCH code that is required to have the same error correction capability without the use of the concatenated code.

In particular, when a plurality of bits instead of one bit are located at an intersection between one column direction code and one row direction code, it can be called block-wise product codes (BW-PC). The BW-PC is able not only to apply a component code, which is more powerful than the product code in which one bit is located at the intersection, in the column direction and in the row direction but also to recognize the occurrence location of the error through the column direction code and the row direction code.

In the embodiment of the present invention, in the BW-PC, it is able to apply a separate error correction code in response to erasure information created in the intersection block between the column direction and the row direction. Here, although it is not possible to determine whether a decoding result value from the erasure information is right or wrong, it's possible to realize the decoding result value includes errors.

Hereafter, detailed technical characteristics to be embodied in the present invention will be described in detail with reference to the accompanying drawings.

Figure 1A:
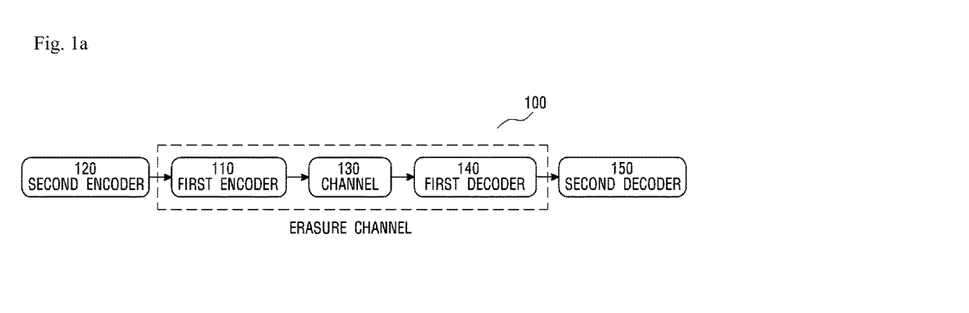
FIG. 1a is a view showing a configuration of a concatenated error correction device according to an embodiment of the present invention.

FIG. 1a is a view showing a configuration of a concatenated error correction device according to an embodiment of the present invention. The concatenated error correction device 100 according to the embodiment of the present invention may include a first encoder 110 and a second encoder 120 at the sending end.

Figure 2A:
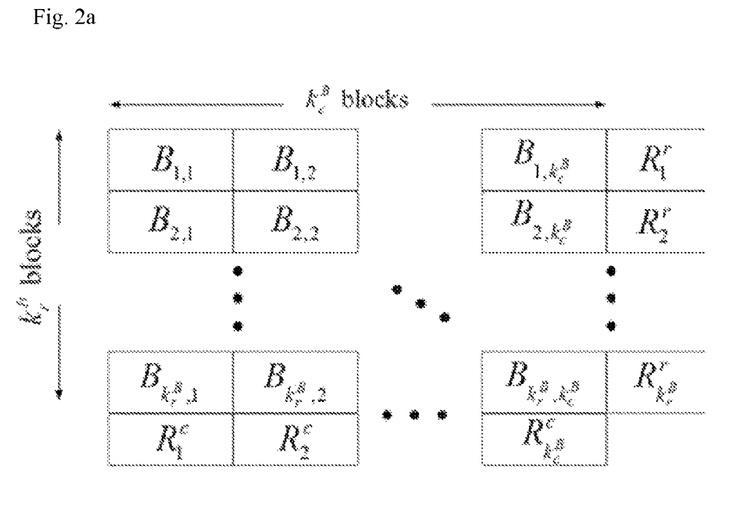
FIG. 2a is a view showing a structure of a block-wise product code after a first encoder of the concatenated error correction device according to the embodiment of the present invention encodes.
Figure 2B:
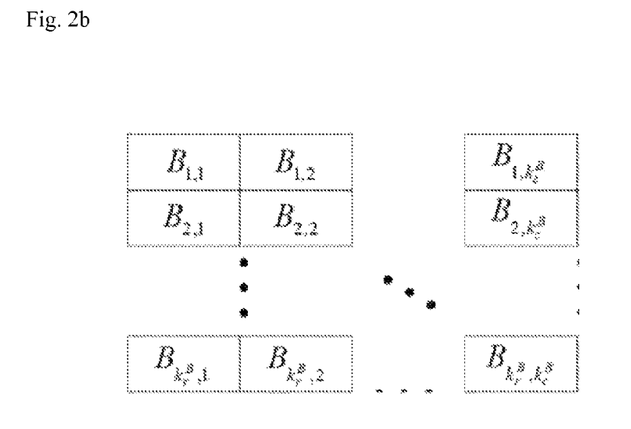
FIG. 2b is a view showing a structure of a code after a second encoder of the concatenated error correction device according to the embodiment of the present invention encodes.

FIG. 2a is a view showing a structure of the block-wise product code after the first encoder of the concatenated error correction device according to the embodiment of the present invention encodes. FIG. 2b is a view showing a structure of a code after the second encoder of the concatenated error correction device according to the embodiment of the present invention encodes.

The first encoder 110 according to the embodiment of the present invention may, as shown in FIG. 2a, encode a plurality of blocks "B" arranged in the column direction and the row direction into the BW-PC consisting of column codes and row codes by applying a first error correction code to the blocks "B" in each of the column direction and the row direction. One column code and one row code share one block "B". Here, each of the blocks may include a plurality of bits encoded through the below-described second encoder 120.

In the embodiment of the present invention, it may be regarded that the BW-PC encoded through the first encoder 110 is a generalized form of the product code where the column code and the row code share one bit. An advantage of the technique of sharing the block instead of a single bit is to use the component code which is longer than a simple product code and has excellent error correction capability. Meanwhile, when a first decoder 140 fails to decode in the future, only the information on where the error has occurred can be used.

Hereafter, a column direction component code and a row direction component code of the first encoder 110 are the first error correction code, and a case where the BCH code is applied as the first error correction code will be described with reference to an example. Any code capable of correcting and detecting the error, such as the BCH code, Hamming code, Reed-Solomon code, etc., can be used as the first error correction code. In FIG. 2a, it is premised that the lengths of the column and row codes, a message length, and the error correction capability are $n_r$, $k_r$, and $t_r$ respectively. $B_{i,j}$ represents a block shared by the $i^{th}$ column code and the $i^{th}$ row code. $n_B$ is defined as the number of the bits that one block has. In FIG. 2a, $R^c_i$ and $R^r_j$ represent blocks respectively constituting parities of the $i^{th}$ column code and the $j^{th}$ row code. Here, the one block "B" shown in FIG. 2a may correspond to one symbol or the multiple (Ni) symbols encoded by a second error correction code in the second encoder 120.

In the further, when a decoder like the first decoder 140 decodes generally repeatedly the BW-PC in the row direction and the column direction, an error floor occurs in a low raw bit error rate (BER) region and the error floor occurs by a specific dominant error pattern. Such an error pattern occurs when one or two pairs of the row code and column code fails to decode.

In general, for the purpose of reducing the error floor, the soft output information is obtained by applying a repeated reading process to the data of the block where the erasure information has been generated, and then reliability based decoding is performed by using the soft output information. As such, multiple readings should be carried out to obtain the soft output information. However, this causes a significant reduction of the data read speed of a system.

Therefore, a technique capable of efficiently reducing the error floor only through hard output information by applying the second error correction code as an erasure correction code to the block shared by the column code and row code in the BW-PC is proposed by the embodiment of the present invention. The erasure correction code, i.e., the second error correction code according to the embodiment of the present invention is a linear block code which is systematic and has linearity. One parity symbol is formed through a linear combination of a plurality of source symbols. Likewise, a symbol erased by the first decoder 140 may be formed through a linear combination of the other symbols. Here, the second decoder 150 may previously acquire necessary information on the location or order of the symbol.

The erasure correction code, for example, Low density parity check (LDPC) code, Reed-Solomon code, Tornado code, Fountain code and Raptor code, etc., can be used as the second error correction code.

Hereafter, an example in which the raptor code is applied as the erasure correction code will be described.

It is premised that the one block "B" shown in FIG. 2*a* corresponds to one raptor symbol, that is, it is premised that $N_i=1$. In this case, the second encoder 120 may receive K number of source symbols and apply the second error correction code to the source symbols, and then encode into N number of symbols including N-K number of parity symbols. Here, the K number of source symbols include $Kn_B$ number of source bits. The N number of generated symbols may be, as shown in FIG. 2*b*, arranged in a matrix consisting of $k_c^B$ number of columns and $k_r^B$ number of rows. That is, the N number of symbols encoded through the second error correction code form, as shown in FIG. 2*b*, the plurality of blocks "B". Here, N and K may be positive integers, i.e., natural numbers.

One block $B_{ij}$ may consist of multiple raptor symbols. In this case, the number of the source symbols which are input to the second encoder 120 is $N_iK$, and the number of the parity symbols is $N_i(N-K)$. The total number of the raptor symbols is $N_iN$. In FIGS. 2*a* and 2*b*, each block ($B_{ij}$) may consist of $N_i$ number of raptor symbols.

For convenience of understanding, the encoding technique of the first encoder 110 has been described prior to the encoding technique of the second encoder 120. However, the first encoder 110 encodes the raptor symbol generated by the second encoder 120 and arranged, as shown in FIG. 2*b*, in the form of multiple blocks into the BW-PC. In other words, the first encoder 110 may encode the $k_c^B$ number of columns and the $k_r^B$ number of rows in the plurality of blocks shown in FIG. 2*b* and may generate the BW-PC, i.e., the output of the first encoder 110 shown in FIG. 2*a*.

The concatenated error correction device 100 according to the embodiment of the present invention further includes the first decoder 140 and a second decoder 150. In FIG. 1*a*, the data encoded by the first and the second encoders 110 and 120 is transmitted to the first decoder 140 and the second decoder 150 through a data channel 130. The data channel 130 may be used for information transmission in a digital storage or a wireless and wired network.

The first decoder 140 according to the embodiment of the present invention decodes the BW-PC received from, for example, a channel detector (not shown), by using the first error correction code. The first decoder 140 may include a column decoder and a row decoder.

First, the first decoder 140 may repeatedly perform the decoding by using the column decoder and the row decoder. After the column decoder performs BCH decoding (e.g., Berlekamp-Masseay decoding) for each column code by using general hard output information, the row decoder sequentially decodes each row code by using the result of the column decoder. Through this, the decoding is completed one time. The first decoder 140 may repeatedly perform the above-described decoding process. Here, the repeated decoding may continue until all the errors are corrected or additional error correction does not occur in the BW-PC received as a result of the decoding. Otherwise, the decoding may be repeated as many times as the maximum number of times of repetition. When the first decoder 140 completes the decoding, the block where the error correction has failed is processed as erased and the symbols included in the corresponding block is classified into erased symbols.

The second decoder 150 may perform the decoding by using the second error correction code so as to recover the erased symbol. That is, the second decoder may obtain the position of the erased symbol from the first decoder 140 and may know in advance the information on which symbol is required in order to correct the error of the corresponding erased symbol. Therefore, the second decoder is able to recover the corresponding erased symbol by using the information on the linearly combined symbols.

Here, a problem that may occur is that when the entire length of the code is small, the length of each of the column code and the row code becomes smaller, so that a probability of miss-correction in which each component code is decoded into another codeword instead of an actually transmitted codeword occurs may become higher. To overcome this, in the embodiment of the present invention, it is intended that an error correction capability value "t" of the column code and the row code are randomly set within a range from greater than 0 to a maximum value of the error correction capability value. That is, in the embodiment of the present invention, the error correction capability value "$(t_r, t_r)$" that the component code has is intended to have a decoding sphere randomly reduced during the decoding process. In this case, a space itself between the codewords is not reduced, however, the decoder detects a valid codeword only within the reduced error correction capability value "t", and if not, it is regarded that the decoding is unsuccessful. As a result, the probability that the miss-correction occurs may be significantly reduced.

For the purpose of understanding, the error correction capability value "t" will be described as follows. The error correction capability value "t" of the first error correction code is deterministically determined by a code length "n" and an information length "k" in the BCH code, Reed-Solomon code, Hamming code, etc. In general, the decoding process may be divided into determining where the error occurred and finding a valid value in the corresponding error occurrence position. Here, in the determining step, if the errors of which the number is less than the error correction capability value "t" occur, the decoding process is performed, and if the errors of which the number is greater than the error correction capability value "t" occur, the decoding is unsuccessful and terminated. Therefore, for example, in a case where the error correction capability value "t" of a code capable of correcting five errors is reduced and set as 3, when four errors occur, the decoder determines that the decoding is unsuccessful and terminates the decoding even though the errors can be corrected by the corresponding code.

Figure 1B:
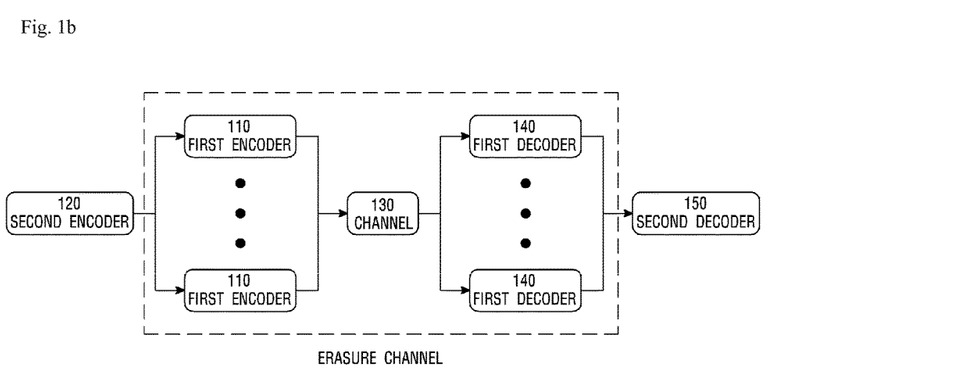
FIG. 1b is a view showing a configuration of a concatenated error correction device according to an embodiment of using a plurality of first error correction codes with respect to one second error correction code.

FIG. 1*b* is a view showing a configuration of a concatenated error correction device according to an embodiment of using a plurality of first error correction codes with respect to one second error correction code. As shown in FIG. 1*b*, the symbols encoded by the second encoder 120 are divided into a plurality of pieces. The divided pieces are, respectively, inputted to a plurality of first encoders 110 included in the sending end of the concatenated error correction device 100. Here the number of the divided pieces may be the same with that of the first encoders 110 and the lengths of the pieces may be the same with each other. Each of the first encoders 110 performs the same function with that of the first encoder 110 shown in FIG. 1*a* by using the inputted piece of symbols. Here, the plurality of the first encoders 110 may use the same or different first error correction code with each other. Each of the first encoder 110 may encodes the inputted symbols using the first error correction code into its own BW-PC. The BW-PCs, all together, respectively generated by the plurality of the first encoders 110 can configure a final concatenated code. Likewise with the FIG. 1a, the final code words transmitted through a data channel 130 experience the decoding procedure which is a reverse procedure of the encoding procedure by the first and second encoders 110 and 120. Specifically, the final code words transmitted through the data channel 130 are divided into a plurality of pieces. The divided pieces are, respectively, inputted to a plurality of first decoders 140. The results from the decoding of the first decoders 140 are united again and inputted to the second encoder 150. The structure and function of each of the first encoders 110 and decoders 140 are the same with those of the first encoder 110 and decoder 140 explained referring to FIGS. 1a to 2b and thus the detailed explanation thereof is omitted here.

Figure 3A:
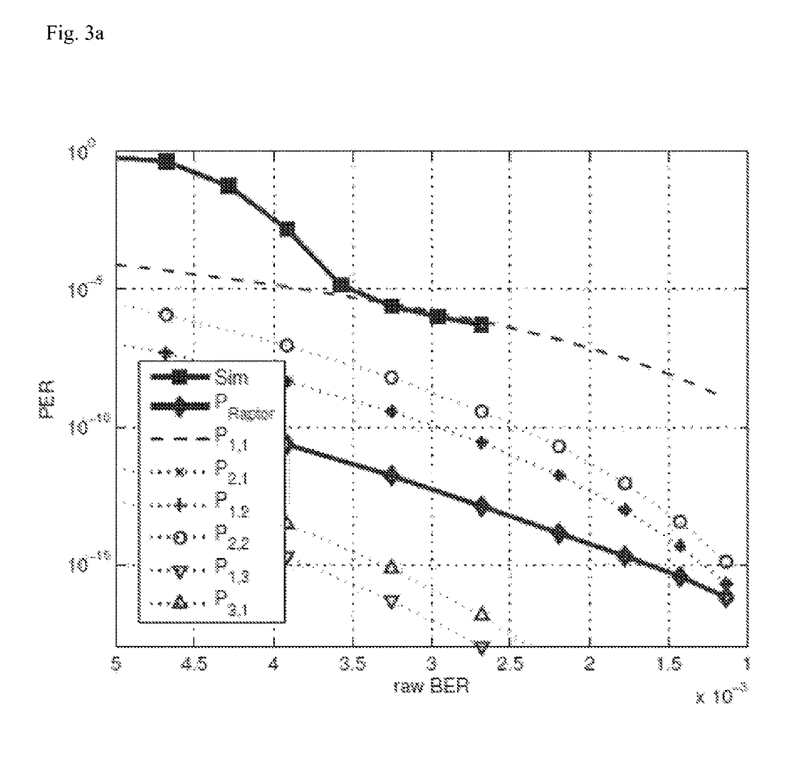
FIG. 3a is a graph showing simulation results of the performance of a concatenated error correction technique according to the embodiment of the present invention and the performance of a conventional error correction technique.

FIG. 3a is a graph showing simulation results of the performance of a concatenated error correction technique according to the embodiment of the present invention and the performance of a conventional error correction technique. In FIG. 3a, a case "$P_{raptor}$" where the concatenated error correction technique according to the embodiment of the present invention uses a 8 KB BW-PC with a code rate of 0.93 as an inner code and uses the raptor code as an outer code is shown by a graph marked with lozenges. Also, a case "$S_{im}$" where the conventional error correction technique simply uses only the BW-PC is shown by a graph marked with quadrangles. In FIG. 3a, it can be seen that, with respect to the entire raw BER, the concatenated error correction technique according to the embodiment of the present invention has a performance superior to that of the conventional error correction technique from the viewpoint of a page per rate (PER). Here, "Pi,j" represents a probability of a dominant event where i number of column decoders and j number of row decoders fail to decode.

Figure 3B:
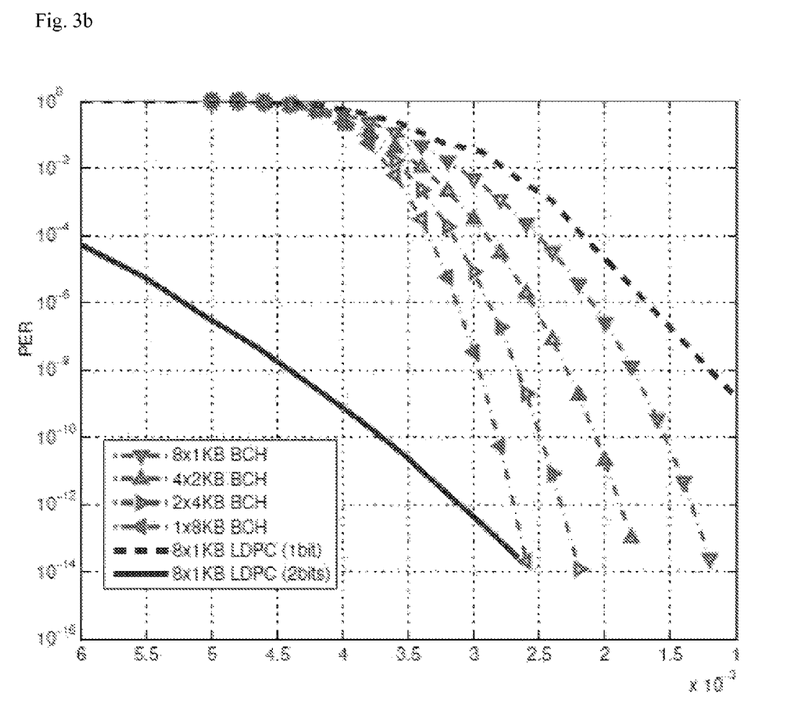
FIG. 3b is a graph showing the simulation result of the performance of the conventional error correction technique.

FIG. 3b is a graph showing the simulation result of the performance of the conventional error correction technique. FIG. 3b shows performances of an 8 KB BCH code with a code rate of 0.93 and an 8 KB LDPC code with a code rate of 0.93 for the comparison with the concatenated error correction technique according to the embodiment of the present invention of FIG. 3a. In FIG. 3b, the performances of the BCH code which have mutually different codeword sizes and are relatively long are shown by graphs marked with triangles. Also, in FIG. 3b, the performance of the LDPC code through use of the hard output information is denoted by a dotted line and a solid line. Here, the dotted line represents the performance of the LDPC code through use of the 1 bit-quantized hard output information, and the solid line represents the performance of the LDPC code through use of the 2 bit-quantized hard output information.

It can be understood that the performance of the concatenated error correction technique according to the embodiment of the present invention of FIG. 3a is superior to the performance of the long BCH code or the LDPC using 1-bit quantized hard output information of FIG. 3b, and is superior or similar to the performance of the LDPC using 2-bit quantized hard output information.

As described above, the concatenated error correction technique according to the embodiment of the present invention is able to generate a random erasure channel by using the BW-PC only through the hard output information and to recover the generated erased symbol to the erasure correction code. According to the embodiment of the present invention, the excellent error correction capability can be obtained even by using only the hard output information. Also, according to the embodiment of the present invention, for example, by applying the short BCH code in the BW-PC, it is possible to obtain the error correction capability superior to that of the BCH code having the same entire length of the codeword as that of the short BCH, and also possible to significantly reduce the decoding complexity. Also, according to the embodiment of the present invention, by performing the reading process three times, it is possible to obtain the error correction capability comparable to that of the LDPC error correction technique using the 2-bit quantized information.

Also, the concatenated error correction technique according to the embodiment of the present invention is to form the inner code by applying the ECC (e.g., BCH code) in the column direction and row direction to the entire data arranged two-dimensionally by using two relatively short ECCs by the product operation. Then, by doing this, the erased symbol generated by generating the erasure channel is effectively recovered by the erasure correction code (e.g., non-binary low-density generator matrix (NB-LDGM) code, raptor code) as the outer code. As a result of this, the error correction capability can be effectively improved.

The foregoing embodiments of the present invention are disclosed to solve the technical problems. It is possible for those skilled in the art to change, modify and add, and the like within the spirit and scope of the present invention. It should be regarded that the change, modification and the like belong to the following claims.

What is claimed is:

1. A concatenated error correction device comprising:
   a second encoder configured to receive K number of source symbols, the second encoder configured to apply a second error correction code to the K number of source symbols to generate N number of symbols including N-K number of parity symbols, the N number of symbols arranged in a matrix wherein each element of the matrix is a B block, the matrix comprising a plurality of B blocks, the matrix including $k_r^B$ number of rows of B blocks and $k_c^B$ number of columns of B blocks, wherein said K and N are positive integers and N is larger than K and each block of the plurality of B blocks comprises a plurality of bits and each block of the plurality of B blocks comprises one or more of the N number of symbols; and
   a first encoder configured to receive the plurality of B blocks from the second encoder, the first encoder configured to apply a first error correction code to the B blocks in each row of the $k_r^B$ number of rows of B blocks to generate $k_r^B$ number of row codes and to apply the first error correction code to the B blocks in each column of the $k_c^B$ number of columns of B blocks to generate $k_c^B$ number of column codes, wherein each B block of the plurality of B blocks is shared by a corresponding one of the $k_c^B$ number of column codes and a corresponding one of the $k_r^B$ number of row codes.

2. The concatenated error correction device of claim 1, wherein at least one first error correction code is concatenated with one second error correction code.

3. The concatenated error correction device of claim 1, wherein the first error correction code is any one of Bose-Chadhuri-Hocquenghem (BCH) code, Hamming code, and Reed-Solomon code.

4. The concatenated error correction device of claim 1, wherein the second error correction code is any one of Low density parity check (LDPC) code, Reed-Solomon code, Tornado code, Fountain code and Raptor code.

5. The concatenated error correction device of claim 1, wherein a symbol of the N number of symbols is entire one B block of the plurality of B blocks or a part of one B block of the plurality of B blocks.

6. The concatenated error correction device of claim 1, further comprising:
   a first decoder which decodes the block-wise product code received from a channel detector, by applying the first error correction code; and
   a second decoder which decodes a B block where the first decoder has failed to decode, by applying the second error correction code.

7. The concatenated error correction device of claim 6, wherein the first decoder comprises a column decoder and a row decoder, and wherein the B block where the first decoder has failed to decode is the B block shared by a corresponding one of the $k_r^B$ number of row codes where the row decoder has failed to decode and a corresponding one of the $k_c^B$ number of column codes where the column decoder has failed to decode.

8. The concatenated error correction device of claim 7, wherein the first decoder repeatedly decodes by using the column decoder and the row decoder.

9. The concatenated error correction device of claim 7, wherein error correction capability values "t" of a column code and a row code are randomly set within a range from greater than 0 to a maximum value of the error correction capability value.

* * * * *